(12) United States Patent
Sills et al.

(10) Patent No.: US 12,185,552 B2
(45) Date of Patent: Dec. 31, 2024

(54) MEMORY ARRAYS AND METHODS OF FORMING AN ARRAY OF MEMORY CELLS

(71) Applicant: Micron Technology, Inc., Boise, ID (US)

(72) Inventors: Scott E. Sills, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 654 days.

(21) Appl. No.: 17/400,526

(22) Filed: Aug. 12, 2021

(65) Prior Publication Data

US 2021/0375992 A1 Dec. 2, 2021

Related U.S. Application Data

(62) Division of application No. 16/556,615, filed on Aug. 30, 2019, now Pat. No. 11,121,177, which is a division of application No. 15/987,613, filed on May 23, 2018, now Pat. No. 10,431,629, which is a division of application No. 14/993,306, filed on Jan.
(Continued)

(51) Int. Cl.
   *H10B 63/00* (2023.01)
   *H10N 70/00* (2023.01)
   *H10N 70/20* (2023.01)

(52) U.S. Cl.
   CPC ............ *H10B 63/30* (2023.02); *H10B 63/80* (2023.02); *H10N 70/011* (2023.02); *H10N 70/023* (2023.02); *H10N 70/061* (2023.02); *H10N 70/068* (2023.02); *H10N 70/24* (2023.02); *H10N 70/245* (2023.02); *H10N 70/826* (2023.02); *H10N 70/8265* (2023.02); *H10N 70/841* (2023.02); *H10N 70/882* (2023.02); *H10N 70/883* (2023.02)

(58) Field of Classification Search
   CPC .. H10N 70/883; H10N 70/882; H10N 70/841; H10N 70/245; H10N 70/24; H10N 70/011; H10N 70/826; H10N 70/061; H10N 70/8265; H10B 63/80; H10B 63/30
   See application file for complete search history.

(56) References Cited

U.S. PATENT DOCUMENTS

| | | | | | |
|---|---|---|---|---|---|
| 5,622,881 | A | * | 4/1997 | Acocella | H10B 41/49 |
| | | | | | 257/E27.103 |
| 5,723,381 | A | * | 3/1998 | Grewal | H01L 21/28 |
| | | | | | 438/692 |

(Continued)

*Primary Examiner* — Mary A Wilczewski
(74) *Attorney, Agent, or Firm* — Wells St. John P.S.

(57) ABSTRACT

A method of forming an array of memory cells includes forming lines of covering material that are elevationally over and along lines of spaced sense line contacts. Longitudinal orientation of the lines of covering material is used in forming lines comprising programmable material and outer electrode material that are between and along the lines of covering material. The covering material is removed over the spaced sense line contacts and the spaced sense line contacts are exposed. Access lines are formed. Sense lines are formed that are electrically coupled to the spaced sense line contacts. The sense lines are angled relative to the lines of spaced sense line contacts and relative to the access lines. Other embodiments, including structure independent of method, are disclosed.

20 Claims, 5 Drawing Sheets

Related U.S. Application Data 12, 2016, now Pat. No. 10,008,541, which is a division of application No. 13/485,488, filed on May 31, 2012, now Pat. No. 9,240,548.

(56) References Cited

U.S. PATENT DOCUMENTS

| | | | | |
|---|---|---|---|---|
| 6,734,482 B1* | 5/2004 | Tran | H10B 12/482 | 257/296 |
| 6,764,894 B2* | 7/2004 | Lowrey | H10N 70/8828 | 438/386 |
| 6,770,531 B2* | 8/2004 | Lowrey | H10N 70/801 | 438/257 |
| 7,314,776 B2* | 1/2008 | Johnson | H10N 70/061 | 438/238 |
| 7,394,089 B2* | 7/2008 | Doyle | H10N 70/061 | 257/209 |
| 7,482,616 B2* | 1/2009 | Song | H10N 70/061 | 257/63 |
| 7,504,653 B2* | 3/2009 | Lung | H10N 70/8833 | 257/4 |
| 7,517,754 B2* | 4/2009 | McDaniel | H01L 28/90 | 438/618 |
| 7,615,439 B1* | 11/2009 | Schricker | H01L 27/101 | 438/237 |
| 7,989,795 B2* | 8/2011 | Chen | H10N 70/068 | 438/102 |
| 8,026,543 B2* | 9/2011 | Song | H01L 29/7843 | 257/296 |
| 8,138,562 B2* | 3/2012 | Mao | H10B 61/00 | 257/E29.323 |
| 8,163,646 B2* | 4/2012 | Kang | H10B 12/09 | 257/532 |
| 8,487,369 B2* | 7/2013 | Kim | H10B 12/482 | 438/270 |
| 8,536,013 B2* | 9/2013 | Kim | H10N 70/8828 | 257/E21.52 |
| 8,570,786 B2* | 10/2013 | Murooka | H10N 70/8836 | 365/163 |
| 8,610,099 B2* | 12/2013 | Vereen | H10N 70/801 | 438/692 |
| 8,685,783 B2* | 4/2014 | Shen | H10N 70/841 | 438/102 |
| 8,691,622 B2* | 4/2014 | Smythe | H10N 70/826 | 438/102 |
| 8,921,818 B2* | 12/2014 | Tu | H10N 70/823 | 257/4 |
| 8,988,926 B2* | 3/2015 | Pellizzer | H10N 70/068 | 365/148 |
| 9,029,827 B2* | 5/2015 | Vereen | H10B 63/84 | 257/E29.326 |
| 9,076,962 B2* | 7/2015 | Hong | H10B 63/30 | |
| 9,240,548 B2* | 1/2016 | Sills | H10N 70/023 | |
| 10,008,541 B2* | 6/2018 | Sills | H10N 70/245 | |
| 10,158,073 B2* | 12/2018 | Chou | H10N 70/068 | |
| 10,431,629 B2* | 10/2019 | Sills | H10N 70/011 | |
| 11,121,177 B2* | 9/2021 | Sills | H10N 70/841 | |
| 2003/0047727 A1* | 3/2003 | Chiang | H10N 70/826 | 257/3 |
| 2004/0113232 A1* | 6/2004 | Johnson | H10N 70/821 | 257/529 |
| 2005/0263829 A1* | 12/2005 | Song | H10N 70/063 | 257/528 |
| 2006/0284225 A1* | 12/2006 | Popp | H10B 12/488 | 257/E21.654 |
| 2007/0045606 A1* | 3/2007 | Magistretti | H10B 63/32 | 430/311 |
| 2007/0170487 A1* | 7/2007 | Heitmann | H01L 28/91 | 438/399 |
| 2008/0048169 A1* | 2/2008 | Doyle | H10N 70/231 | 257/209 |
| 2008/0191186 A1* | 8/2008 | Lung | H10B 63/30 | 438/102 |
| 2008/0225576 A1* | 9/2008 | Zhong | H10B 61/00 | 365/158 |
| 2008/0265238 A1* | 10/2008 | Chen | H10N 70/8828 | 438/102 |
| 2009/0101881 A1* | 4/2009 | Song | H10N 70/063 | 257/E45.002 |
| 2010/0177561 A1* | 7/2010 | Liu | G11C 11/161 | 365/171 |
| 2011/0101450 A1* | 5/2011 | Kim | H10B 12/482 | 257/330 |
| 2011/0133150 A1* | 6/2011 | Lung | G11C 13/0004 | 257/3 |
| 2012/0001346 A1* | 1/2012 | Kim | H10B 12/0335 | 257/774 |
| 2012/0074518 A1* | 3/2012 | Kim | H01L 29/4236 | 257/E27.013 |
| 2012/0104339 A1* | 5/2012 | Shen | H10N 70/826 | 438/102 |
| 2013/0026562 A1* | 1/2013 | Beigel | H01L 29/7841 | 257/334 |
| 2013/0207066 A1* | 8/2013 | Vereen | H10N 70/801 | 257/2 |
| 2013/0313678 A1* | 11/2013 | Smythe | H10N 70/063 | 257/E29.325 |
| 2013/0334483 A1* | 12/2013 | Ramaswamy | H10N 70/841 | 257/E47.001 |
| 2014/0024891 A1* | 1/2014 | Motoki | A61B 1/00045 | 600/103 |
| 2014/0138604 A1* | 5/2014 | Liu | H10N 70/231 | 257/4 |
| 2014/0198565 A1* | 7/2014 | Pellizzer | H10N 70/8828 | 365/163 |
| 2014/0231741 A1* | 8/2014 | Vereen | H10N 70/801 | 257/2 |
| 2015/0060823 A1* | 3/2015 | Furuie | H10K 59/88 | 257/40 |
| 2021/0375992 A1* | 12/2021 | Sills | H10N 70/8265 | |

* cited by examiner

US 12,185,552 B2

MEMORY ARRAYS AND METHODS OF FORMING AN ARRAY OF MEMORY CELLS

RELATED PATENT DATA

This patent resulted from a divisional application of U.S. patent application Ser. No. 16/556,615, filed Aug. 30, 2019, entitled Memory Arrays And Methods Of Forming An Array Of Memory Cells", naming Scott E. Sills and Durai Vishak Nirmal Ramaswamy as inventors, which was a divisional application of U.S. patent application Ser. No. 15/987,613, filed May 23, 2018, entitled "Memory Arrays And Methods Of Forming An Array Of Memory Cells", naming Scott E. Sills and Durai Vishak Nirmal Ramaswamy as inventors, now U.S. Pat. No. 10,431,629, which was a divisional application of U.S. patent application Ser. No. 14/993,306, filed Jan. 12, 2016, entitled "Memory Arrays And Methods Of Forming An Array Of Memory Cells", naming Scott E. Sills, and Durai Vishak Nirmal Ramaswamy as inventors, now U.S. Pat. No. 10,008,541, which was a divisional application of U.S. patent application Ser. No. 13/485,488, filed May 31, 2012, entitled "Memory Arrays And Methods Of Forming An Array Of Memory Cells", naming Scott E. Sills and Durai Vishak Nirmal Ramaswamy as inventors, now U.S. Pat. No. 9,240,548, the disclosures of which are incorporated by reference.

TECHNICAL FIELD

Embodiments disclosed herein pertain to memory arrays and to methods of forming an array of memory cells.

BACKGROUND

Memory is one type of integrated circuitry, and is used in computer and other systems for storing data. Memory is usually fabricated in one or more arrays of individual memory cells. The memory cells may be volatile, semi-volatile, or non-volatile. Non-volatile memory cells can store data for extended periods of time, and in many instances in the absence of power to the circuitry. Volatile memory dissipates and is therefore refreshed/rewritten, often multiple times per second, to maintain data storage. Regardless, the memory cells are configured to retain or store memory in at least two different selectable states. In a binary system, the states are considered as either "0" or a "1". In other systems, at least some memory cells may be configured to store more than two levels or states of information.

Integrated circuitry fabrication continues to strive to produce smaller and denser integrated circuits. The smallest and simplest memory cell will likely be comprised of two electrically conductive electrodes having a programmable material between the electrodes. In some instances, the programmable material may be highly oxidizable if exposed to air or other oxygen-containing material during fabrication of the memory cell. This can lead to fabrication of inoperable or inconsistent memory cells.

DETAILED DESCRIPTION OF EXAMPLE EMBODIMENTS

Figure 1:
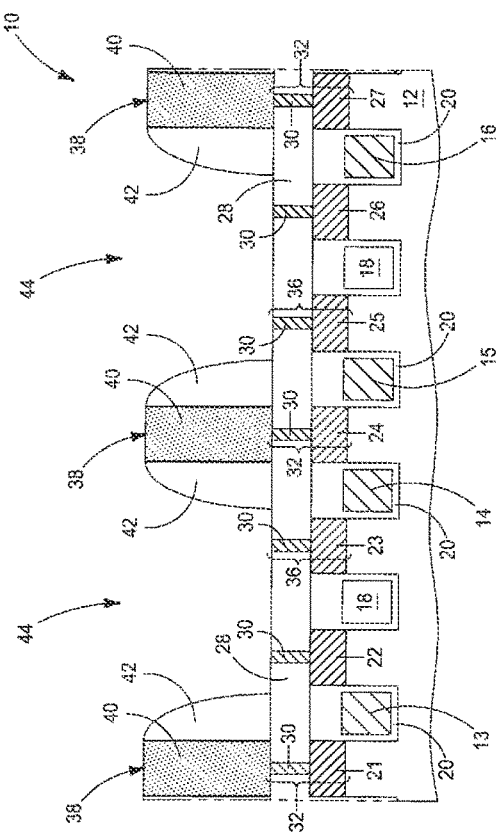
FIG. 1 is a diagrammatic top plan view of a portion of a memory array in fabrication in accordance with an embodiment of the invention.
Figure 2:
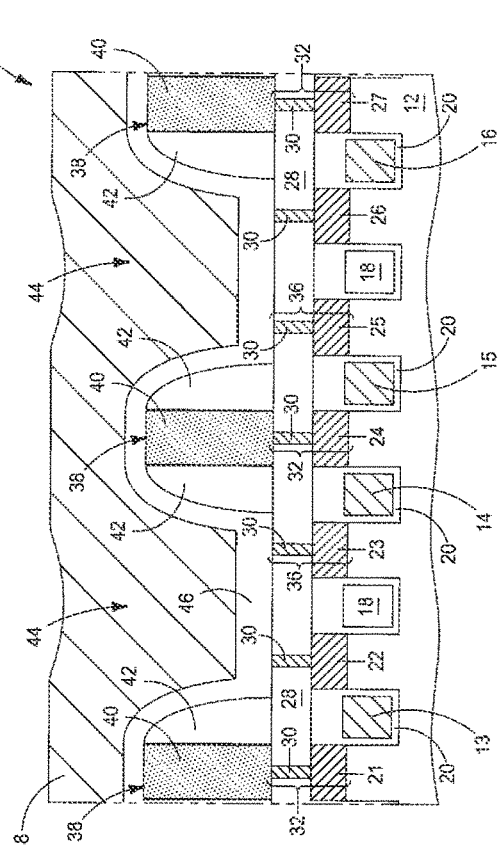
FIG. 2 is a diagrammatic structural cross-section view of a substrate in process in accordance with an embodiment of the invention, and is taken through line 2-2 in FIG. 1.

Embodiments of the invention include methods of forming an array of memory cells, and memory cell arrays independent of method of fabrication. Initial examples are described with reference to FIGS. 1-15. Referring to FIGS. 1 and 2, a portion of an example memory array region with respect to a substrate fragment 10 is shown. Substrate 10 may comprise a semiconductor substrate. In the context of this document, the term "semiconductor substrate" or "semi-conductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 may comprise bulk semiconductor material 12, for example monocrystalline silicon lightly doped with p-type conductivity modifying dopant. Semiconductor-on-insulator and other substrates may be used.

In one embodiment, an array of access lines 13, 14, 15, and 16 (e.g., word lines) is formed as part of substrate 10. The material of access lines 13-16, and other materials referred to herein, may be homogenous or non-homogenous. Example electrically conductive materials for access lines 13-16 include one or more elemental metals, alloys of two or more elemental metals, conductive metal compounds, and/or conductively doped semiconductive material. Isolation lines 18 have been formed between every two of the access lines to provide lateral electric isolation. Isolation lines 18 may be conductive or non-conductive. Dielectric material 20 is shown received about the access lines and isolation lines. Example materials include undoped silicon dioxide, doped silicon dioxide, and silicon nitride.

In one embodiment, source/drain regions 21, 22, 23, 24, 25, 26, and 27 have been formed on opposing sides of individual access lines 13-16. The source/drain regions may, by way of example, comprise n+ doped regions of semiconductor material 12. Dielectric material 28 has been formed over source/drain regions 21-27 and dielectric material 20. Dielectric material 28 may be of the same or different composition from dielectric material 20. Conductive plugs 30 are electrically coupled with individual source/drain regions 21-27, and extend upwardly through dielectric material 28. Any suitable conductive material may be used. Alternate substrates may be used, for example with fewer or more isolation lines, and eliminating dielectric 28 and/or some or all of conductive plugs 30 (when used) at this point in the example method.

Individual source/drain regions 21, 24, 27 and their respective overlying conductive plug 30 may be considered individually or in combination as comprising spaced sense line contacts 32 (e.g., bitline contacts). Further, sense line contacts 32 may be considered as being formed along lines 35 (FIG. 1). Lines 35 in the example embodiment are shown as being linear, although curved, multiple angled linear segments, and other non-linear line layouts may be used. Lines 35 may be parallel relative one another. In one embodiment, sense line contacts 32 are between and along first pairs of access lines. For example, access lines 14 and 15 may be considered as a first access line pair with respect to sense line contacts 32 there-between.

Individual source/drain regions 22, 23, 25, 26 and their respective overlying conductive plug 30 may be considered individually or in combination as comprising spaced inner electrode material 36 for individual memory cells that are being formed. Further, spaced inner electrode material 36 may be considered as being formed along lines 37. Lines 37 in the example embodiment are shown as being linear, although curved, multiple angled linear segments, and other non-linear line layouts may be used. Lines 35 may be parallel relative one another and/or lines 37. In one embodiment, lines 37 of spaced inner electrode material 36 may be considered as being between and along second pairs of the access lines. For example, access lines 13/14 and 15/16 may be considered as respective second access line pairs with respect to spaced inner electrode material 36 there-between. One or more than two lines 37 may be between and along second pairs of the access lines.

Lines 38 of covering material 40 have been formed elevationally over and along lines 35 of spaced sense line contacts 32. Covering material 40 ideally covers at least 50%, and even more ideally 100%, of individual spaced sense line contacts 32. In one embodiment, lines 38 will comprise sacrificial lines (i.e., they will ultimately be removed from the substrate). Accordingly in such event, material 40 may be any of any suitable conductive, semiconductive, and/or dielectric material. If at least some of covering material 40 is to remain over the substrate, it will likely constitute dielectric material. Regardless, example dielectric materials include doped silicon dioxide, undoped silicon dioxide, and silicon nitride.

Lines which comprise programmable material and outer electrode material are ultimately formed. In one embodiment, those lines are between and along the lines of covering material, and in one embodiment are elevationally over and along the lines of spaced inner electrode material. In one embodiment, the longitudinal orientation of the lines of covering material is used in forming the lines comprising programmable and outer electrode materials (e.g., they are formed in a damascene-like manner using the covering material lines).

Figure 3:
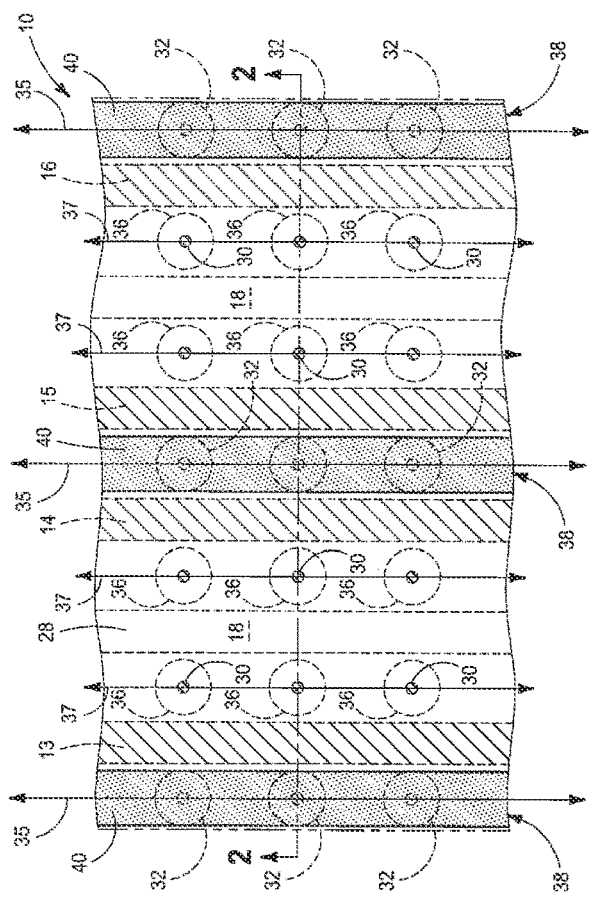
FIG. 3 is a view of the FIG. 2 substrate at a processing step subsequent to that shown by FIG. 2.

Referring to FIG. 3, and in but one embodiment, anisotropically etched sidewall spacers 42 have been formed against sidewalls of covering material lines 38. Spacers 42 may be formed by anisotropically etching a deposited layer of material from over horizontal surfaces to largely remain against vertical surfaces, and may, for example, be used in any pitch multiplication technique. Spacers 42 may be any of conductive, semiconductive, and/or dielectric, perhaps depending upon whether any or all of such spacers remain as part of the substrate in a finished circuitry construction. In one embodiment, anisotropically etched sidewall spacers 42 do not contain oxygen (i.e., are void of detectable oxygen). Regardless of whether using spacers 42, void space 44 may be considered as existing between covering material lines 38.

Figure 4:
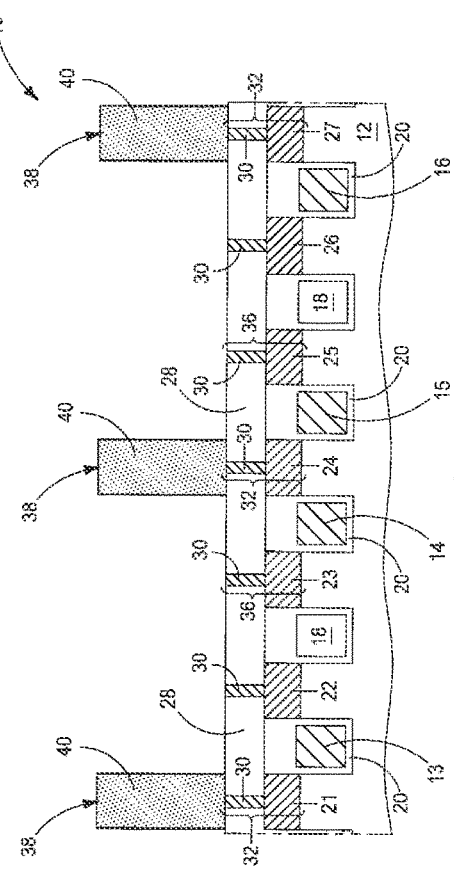
FIG. 4 is a view of the FIG. 3 substrate at a processing step subsequent to that shown by FIG. 3.

Referring to FIG. 4, and in one embodiment, void spaces 44 have been longitudinally lined with a programmable material 46. In one embodiment and as shown, programmable material 46 is formed over covering material lines 38, spacers 42, and to line void space between spacers 42. Programmable material 46 is electrically coupled to spaced inner electrode material 36. Example programmable materials include any one or more materials suitable for use in existing or yet-to-be-developed memory cells, for example in resistive RAM, magnetic RAM, ferroelectric RAM, phase change memory, programmable metallization memory cells, and conductive bridging RAM, including for example semiconductive or dielectric material having mobile dopants provided therein. The invention was primarily motivated in addressing concerns associated with highly oxidizable programmable materials, for example those comprising ion conductor solid electrolytes as disclosed in any of US Patent Publication Nos. 2011/0140065, 2011/0155988, and 2012/0037873. However, any existing or yet-to-be-developed programmable material may be used. The programmable material may be deposited by any one or more suitable deposition technique(s), including physical vapor deposition, chemical vapor deposition (CVD), and atomic layer deposition (ALD), and with or without use of plasma. In one embodiment, programmable material 46 may be oxygen-sensitive. In the context of this document, "oxygen-sensitive programmable material" defines a programmable material which would be subject to composition-changing oxidation if exposed to oxygen-containing material in the course of fabrication of the circuitry, and which may include, for example, exposure to ambient clean room air. In other embodiments, programmable material 46 may not be oxygen sensitive.

Outer electrode material 48 has been deposited over programmable material 46 to over-fill remaining void space 44 between covering material lines 38. In one embodiment, outer electrode material 48 is deposited over covering material lines 38 and spacers 42, and over programmable material 46 to over-fill remaining void space between spacers 42. Outer electrode material 48 may be of the same or different composition as that of inner electrode material 36 (i.e., being one or more elemental metal(s), alloys of two or more elemental metals, conductive metal compounds, and/or conductively doped semiconductive material).

Figure 5:
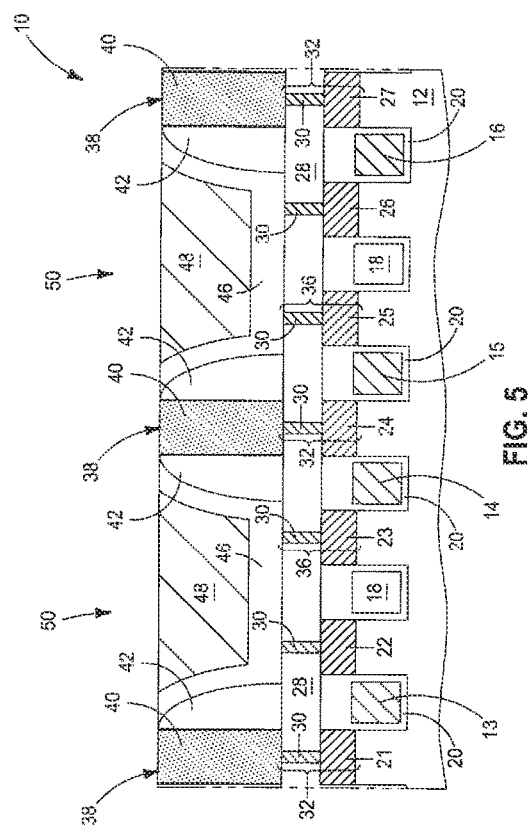
FIG. 5 is a view of the FIG. 4 substrate at a processing step subsequent to that shown by FIG. 4.
Figure 8:
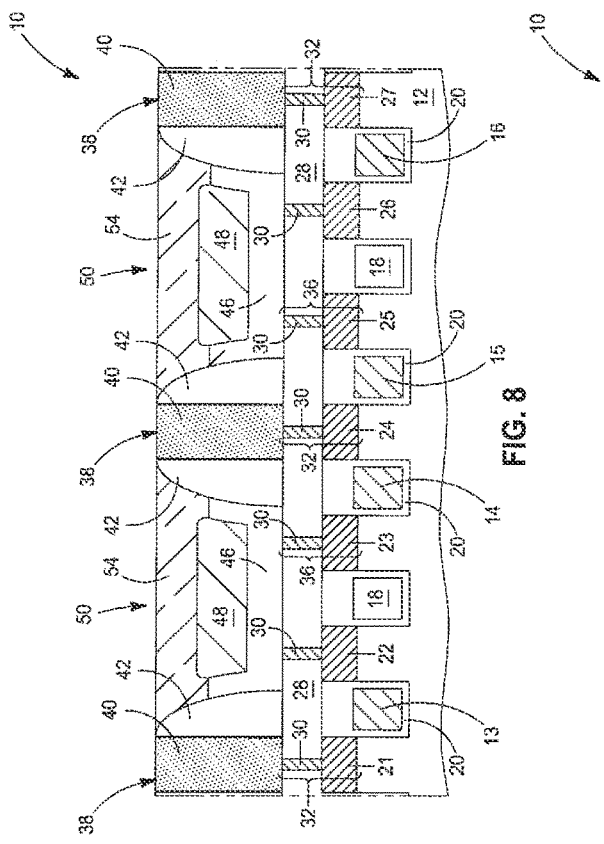
FIG. 8 is a view of the FIG. 7 substrate at a processing step subsequent to that shown by FIG. 7.

Referring to FIG. 5, outer electrode material 48, and in one embodiment programmable material 46, has been removed back at least to an elevationally outermost surface of covering material 40 to form lines 50 which comprise programmable material 46 and outer electrode material 48. Example methods of conducting such removing include etch back and chemical mechanical polishing. In one embodiment, at least some of programmable material 46 of lines 50 is received laterally of outer electrode material 48, for example as shown. Where spacers 42 are used, lines 50 are formed between spacers 42 of adjacent covering material lines 38. In one embodiment, the act of removing forms coplanar elevationally outermost surfaces of covering material 40 and outer electrode material 48, and in one embodiment a planar outermost surface of programmable material 46 which is coplanar with outermost surfaces of covering material 40 and outer electrode material 48, as shown. In one embodiment and as shown, the outer electrode material is removed back at least to an elevationally outermost surface of the covering material to form coplanar elevationally outermost surfaces of the covering material, the spacers, the oxygen-sensitive programmable material, and the outer electrode material.

Described above are but example methods of using longitudinal orientation of covering material lines 38 in forming lines 50 that are between and along covering material lines 38.

All or only some of the covering material is removed from over the spaced sense line contacts. Regardless, the spaced sense line contacts are ultimately outwardly exposed and sense lines are formed that are electrically coupled thereto. The sense lines are angled relative to the lines of spaced sense line contacts and relative to the access lines. Any methods of doing so may be employed, with only some example embodiments next being described with respect to FIGS. 6-18.

Figure 6:
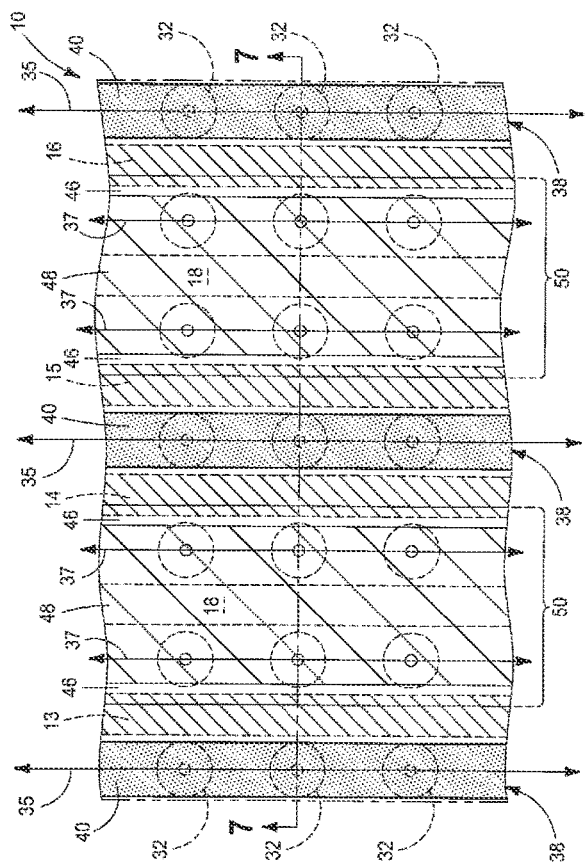
FIG. 6 is a diagrammatic top plan view of the FIG. 5 substrate at a processing step subsequent to that shown by FIG. 5.
Figure 7:
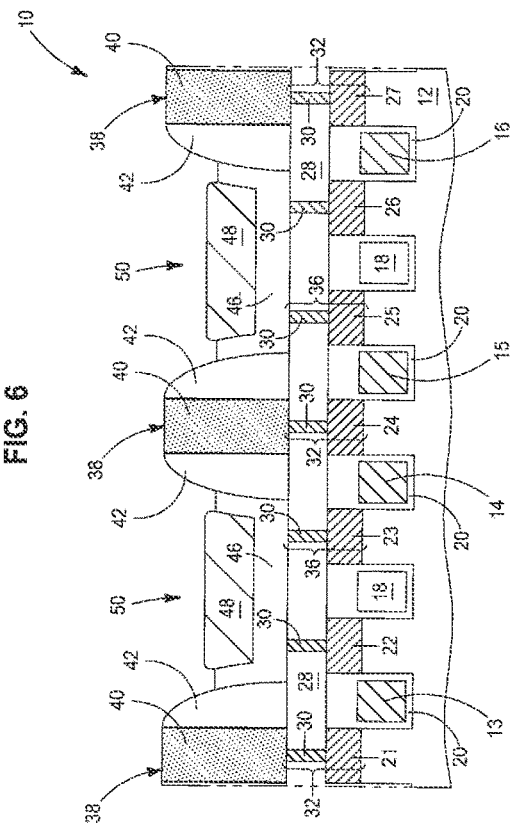
FIG. 7 is a view of the FIG. 6 substrate taken through line 7-7 in FIG. 6.

Referring to FIGS. 6 and 7, outermost surfaces of programmable material 46 and outer electrode material 48 have been elevationally recessed relative to the elevationally outermost surfaces of covering material 40. In one embodiment and as shown, programmable material 46 is elevationally recessed more than is outer electrode material 48. Regardless, the elevationally recessing of the programmable and outer electrode materials may occur in the same step or in multiple steps, for example using one or more etching steps. Where for example programmable material 46 comprises a copper-containing chalcogenide and conductive outer electrode material 48 comprises tungsten, titanium, titanium nitride and/or copper, an example etching chemistry which may be used in a single etching step to produce the construction of FIGS. 6 and 7 includes a mixture of $CH_3COOH$, $H_3PO_4$, and $HNO_3$.

In one embodiment, the outer electrode material is covered with dielectric material having an elevationally outer surface that is coplanar with that of the covering material of the lines of coving material. For example referring to FIG. 8, dielectric material 54 may be deposited over outer electrode material 48, programmable material 46, spacers 42, and covering material 40 to over-fill remaining of the void space between lines 38, followed by planarizing dielectric material 54 back at least to elevationally outermost surfaces of covering material 40 and spacers 42. Dielectric material 54 may be of the same or different composition from that of spacers 42 and/or covering material 40 where such are formed of dielectric material. Ideally, covering material 40 has a composition which may be etched selectively relative to material(s) of spacers 42 and dielectric material 54. In the context of this document, selectivity or a selective etch requires removal of one material at a rate of at least 2:1 compared to another stated material.

Figure 9:
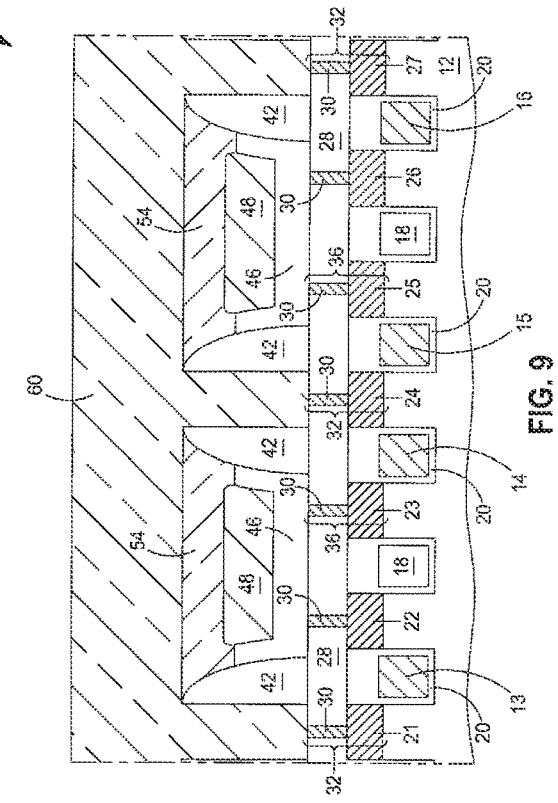
FIG. 9 is a view of the FIG. 8 substrate at a processing step subsequent to that shown by FIG. 8.

Referring to FIG. 9, all of covering material 40 (not shown) of covering material lines 38 (not shown) has been removed, and in one embodiment dielectric 60 has been deposited. Embodiments are described below wherein only some of covering material 40 is removed. Regardless, in one embodiment the act of removing covering material 40 (not shown) is by etching conducted selectively relative to one or more of materials 28, 42, and 54. Further, the act of removing covering material 40 from over spaced sense line contacts 32 may or may not expose the spaced sense line contacts at this point in the method, and regardless of whether conductive material plugs 30 have previously been formed over source/drain regions 21-27. Dielectric 60 may comprise any one or more suitable compositions, with undoped silicon dioxide, doped silicon dioxide, and silicon nitride being examples. In one embodiment, dielectric 60 contains oxygen where, for example, an oxygen-sensitive programmable material 46 is to be everywhere covered by other non-oxygen-containing dielectric. In one embodiment, an oxygen-containing dielectric 60 is deposited to over-fill void space resulting from etching away the covering material lines 38.

As an alternate example where, for example, dielectric 60 is of the same composition as covering material 40 (not shown in FIG. 9), such covering material 40 may not be either wholly or partially removed prior to deposition of dielectric 60. For example in one embodiment, dielectric 60 may be deposited atop the lines 38 of covering material 40 of FIG. 8.

Figure 10:
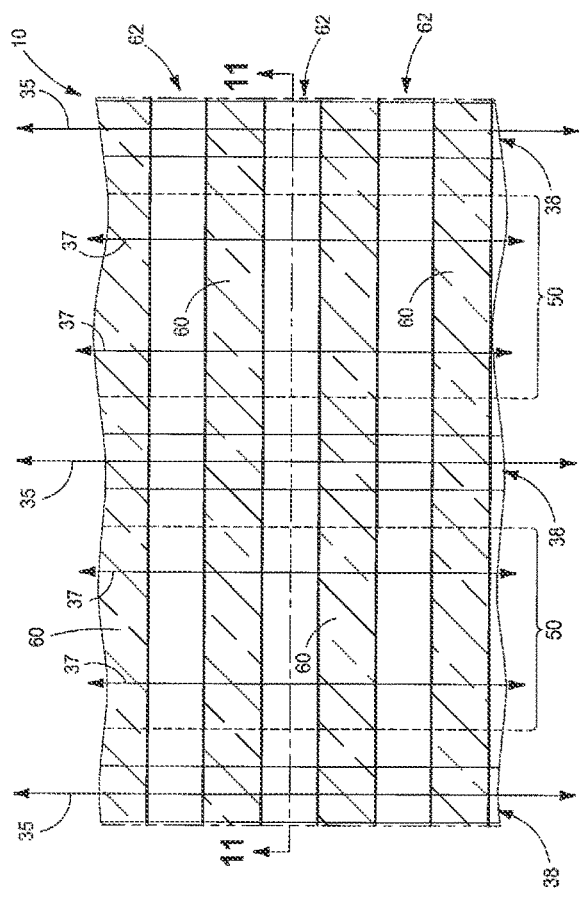
FIG. 10 is a diagrammatic top plan view of the FIG. 9 substrate at a processing step subsequent to that shown by FIG. 9.
Figure 11:
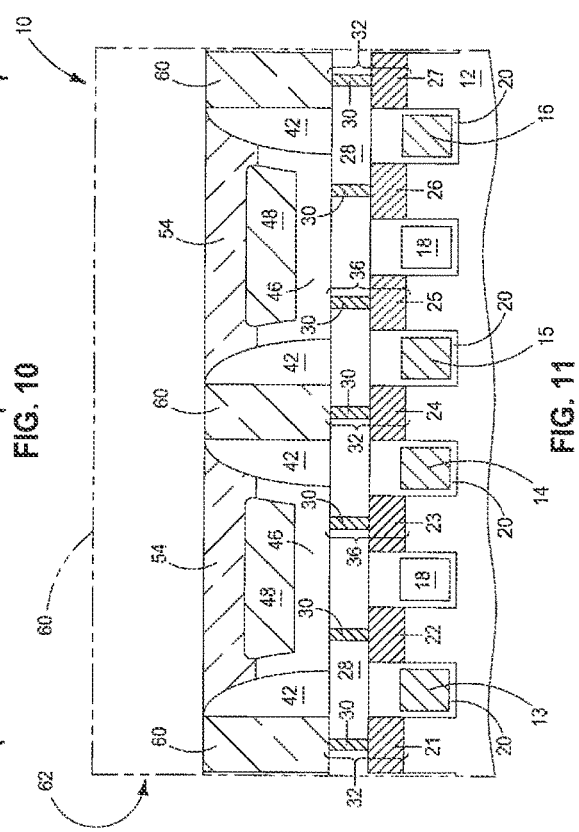
FIG. 11 is a view of the FIG. 10 substrate taken through line 11-11 in FIG. 10.

Regardless and referring to FIGS. 10 and 11, sense line trenches 62 have been etched into dielectric 60. Trenches 62 are angled relative to lines 35 of spaced sense line contacts 32 and relative to access lines 13-16. Trenches 62 are shown as being linear, although any non-linear configuration may be used. In FIG. 10 and subsequent top views, the underlying access lines 13-16, spaced sense line contacts 32, isolation lines 18, and materials 46 and 48 are not shown as they were in FIG. 6 solely for clarity in FIG. 10 and those other top views. Additionally in FIG. 10, elevationally outermost surfaces of dielectric material 60 are hatched whereas the bases of trenches 62 are not, again solely for clarity in FIG. 10.

Figure 12:
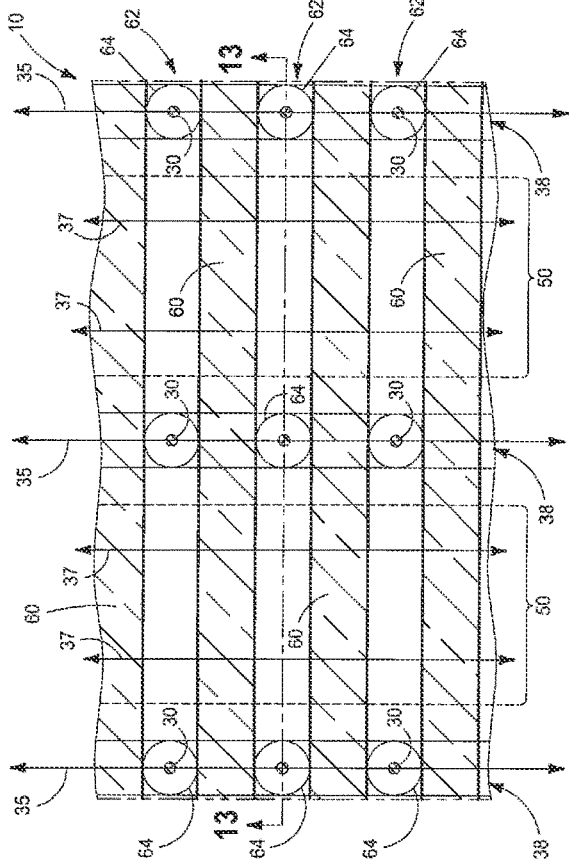
FIG. 12 is a diagrammatic top plan view of the FIG. 10 substrate at a processing step subsequent to that shown by FIG. 10.
Figure 13:
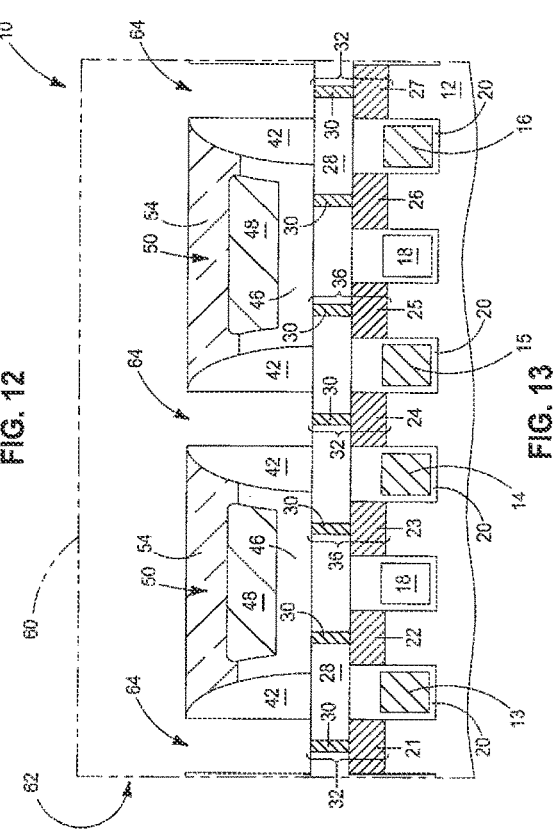
FIG. 13 is a view of the FIG. 12 substrate taken through line 13-13 in FIG. 12.

Referring to FIGS. 12 and 13, individual contact openings 64 have been etched into dielectric 60 at bases of sense line trenches 62 to individual of spaced sense line contacts 32. Alternately but less ideal, contact openings 64 may be etched first and sense line trenches 62 formed by etching thereafter. Regardless, sense line trenches 62 are shown as extending to dielectric material 54. Alternately as an example, the bases of sense line trenches 62 may be elevationally outward of dielectric material 54 (not shown).

Figure 14:
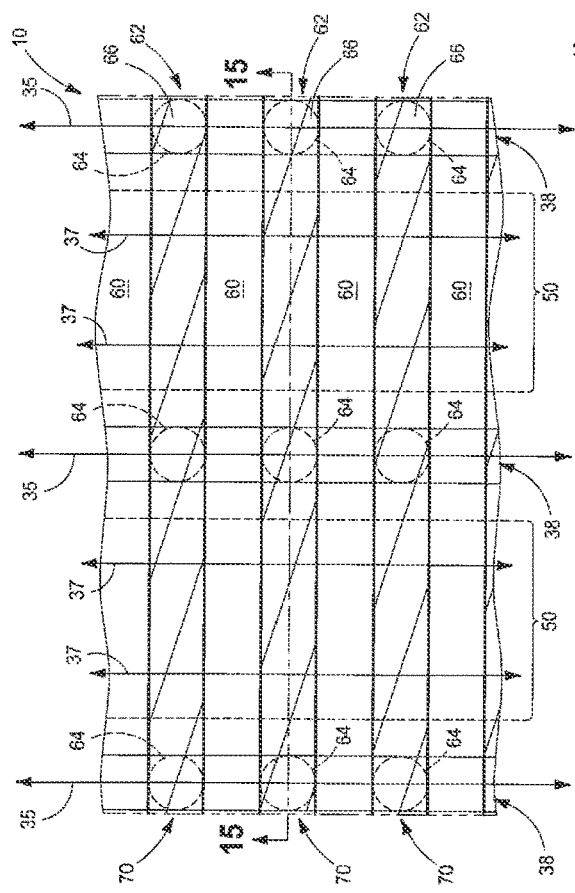
FIG. 14 is a diagrammatic top plan view of the FIG. 12 substrate at a processing step subsequent to that shown by FIG. 12.
Figure 15:
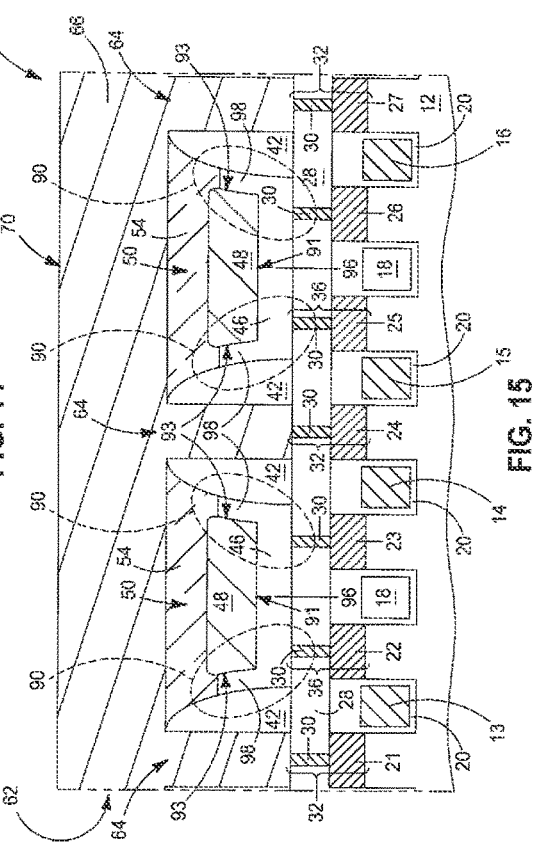
FIG. 15 is a view of the FIG. 14 substrate taken through line 15-15 in FIG. 14.

Referring to FIGS. 14 and 15, conductive material 66 has been deposited into sense line trenches 62 and electrically coupled to sense line contacts 32. Conductive material 66 has then been planarized back at least to an elevationally outmost surface of dielectric 60, thereby forming sense lines 70. Sense lines 70 are angled relative to lines 35 of sense line contacts 32 and relative to access lines 13-16. The previous hatching of the elevationally outermost surfaces of dielectric 60 is removed in FIG. 14 for clarity.

The processing described above are but example techniques of forming sense lines that are electrically coupled to spaced sense line contacts, where the sense lines are angled relative to lines of spaced sense line contacts and relative to the access lines. Other techniques may of course be used. For example and by way of examples only, non-damascene-like techniques such as deposition of conductive material blanketly over the substrate and subtractively patterning thereof may be used, for example without or before depositing dielectric material 60. As another example, contact openings may be etched through covering material 40 over sense line contacts 32 without completely removing all of the covering material 40 of lines 38. Damascene-like processing as described above may then be employed. Alternately, a conductive material could be blanketly deposited to fill those contact openings to electrically couple with the sense line contacts. That material could then be subtractively patterned to form sense line plugs and/or sense lines therefrom.

Accordingly and regardless, the act of wholly or only partially removing the covering material may occur before or after depositing a dielectric 60 when such is deposited. In one embodiment where a dielectric 60 is used, removing of the covering material occurs before the depositing of the dielectric and exposes the spaced sense line contacts (e.g., as occurs in the processing going from FIG. 8 to FIG. 9 before dielectric 60 is deposited). The depositing of the dielectric re-covers the spaced sense line contacts (e.g., as shown in FIG. 9). The spaced sense line contacts are then re-exposed prior to depositing the conductive material (e.g., as shown in FIGS. 12 and 13). This may occur whether the act of removing is of only a portion of the lines of the covering material or is of all of the lines of covering material.

In one embodiment, the dielectric is deposited over the lines of covering material (not shown, but for example as described above in the sixth paragraph that precedes this paragraph). Regardless, the dielectric may be deposited prior to the act of removing the covering material. Alternately as an example, the removing may be of only a portion of the lines of covering material, with the dielectric being deposited after the act of removing the covering material.

Figure 16:
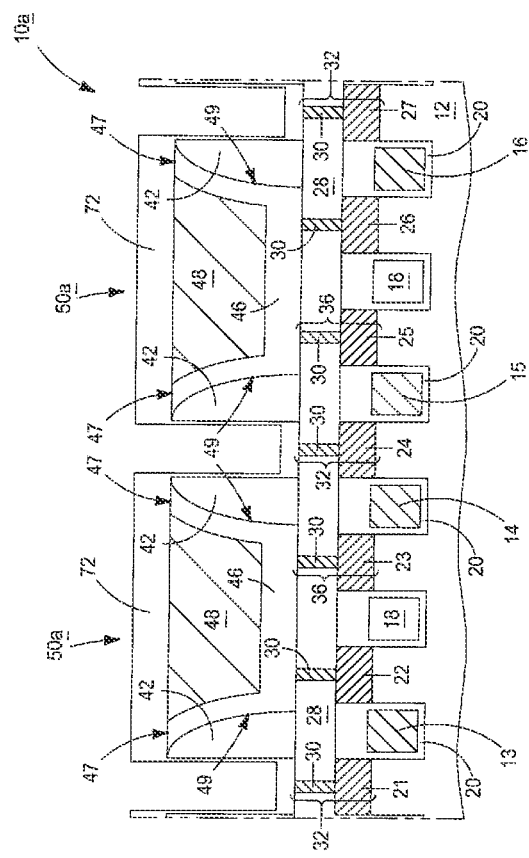
FIG. 16 is a diagrammatic structural cross-section view of a substrate in process in accordance with an embodiment of the invention.

Additional example embodiments are next described with reference to FIGS. 16-18 and a substrate 10a. Like numerals from the above described embodiments have been used where appropriate, with some construction differences being indicated with the suffix "a" or with different numerals. FIG. 16 shows alternate processing to that of FIGS. 6 and 7. Specifically, all of covering material 40 (not shown) of lines 38 (not shown) has been removed from being over spaced sense line contacts 32. In one embodiment, such is conducted selectively relative to outer electrode material 48, and in one embodiment selectively relative to programmable material 46 where such is elevationally outwardly exposed. Regardless, the act of removing may or may not outwardly expose sense line contacts 32 at this point.

For purposes of the continuing discussion, programmable material 46 may be considered as having devotionally outermost surfaces 47 and sidewall surfaces 49. In one embodiment and as shown, the only surfaces of programmable material 46 that are exposed after etching away covering material 40 (not shown) are elevationally outermost surfaces 47. Such processing may occur where, for example, dielectric spacers 42 have been used as shown. Alternately, for example, where spacers 42 are not used, both devotionally outermost surfaces 47 and sidewall surfaces 49 may be exposed (not shown) at the conclusion of removing covering material 40.

Regardless, a first dielectric 72 has been deposited to be thicker atop lines 50a than over bases between lines 50a formed by the act of removing of covering material 40 (not shown). In one embodiment where, for example, programmable material 46 is oxygen-sensitive, first dielectric 72 may not contain oxygen no detectable oxygen being present therein). In one embodiment, a first dielectric 72 that does not contain oxygen covers any exposed oxygen-sensitive programmable material 46. For example and by way of example only, if spacers 42 are not present, first dielectric 72 may directly also cover over sidewalls 49 of programmable material 46.

Figure 17:
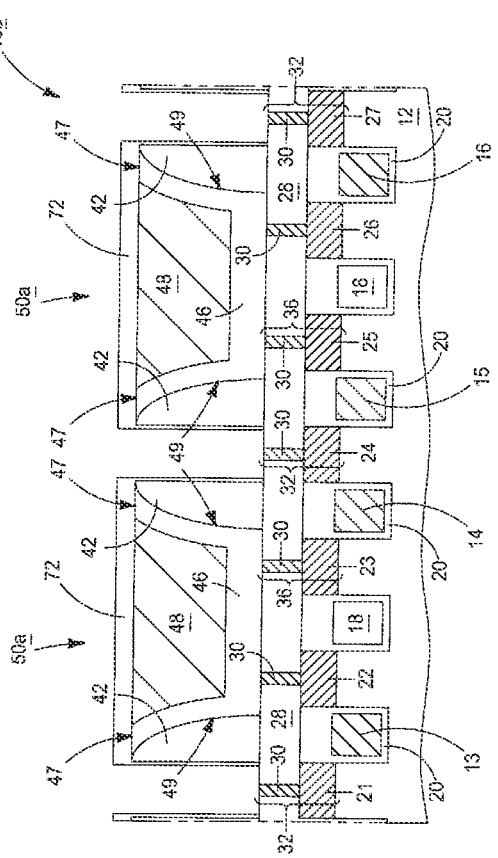
FIG. 17 is a view of the FIG. 16 substrate at a processing step subsequent to that shown by FIG. 16.

Referring to FIG. 17 and in one embodiment, first dielectric 72 is anisotropically etched back to be removed from being over the bases between lines 50a.

Figure 18:
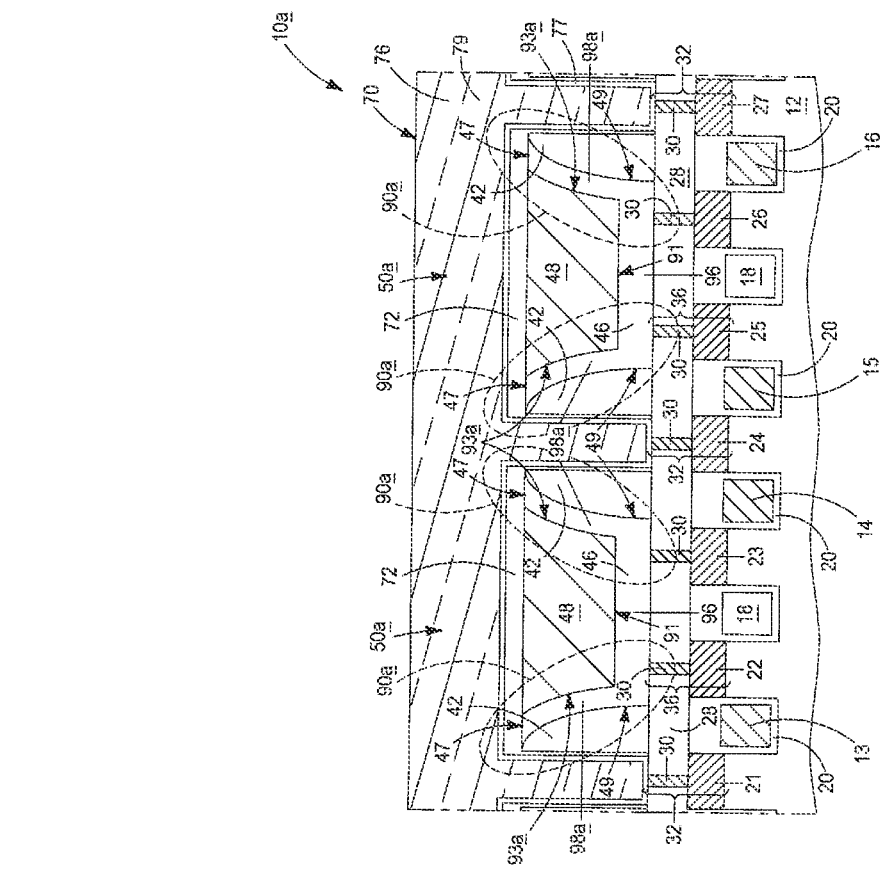
FIG. 18 is a view of the FIG. 17 substrate at a processing step subsequent to that shown by FIG. 17.

Referring to FIG. 18, a second dielectric 76 has been formed over first dielectric 72 to cover sidewalls of lines 50a. In one embodiment and as shown, second dielectric 76 fills void space between lines 50a. In one embodiment and as shown, second dielectric 76 comprises an inner dielectric material 77 (e.g., silicon nitride deposited by atomic layer deposition) and an outer dielectric material 79 (e.g., an oxygen-containing dielectric) formed there-over. Regardless, dielectric 76 may be patterned in a damascene-like manner in producing sense lines (not shown), for example as described in the embodiments above with respect to dielectric 60 in forming sense lines. Alternately, dielectric 76 and sense line material (not shown) may be processed in other manners that are not necessarily damascene-like.

Embodiments of the invention include memory arrays independent of method of fabrication. In one embodiment, a memory array comprises access lines and sense lines angled relative to the access lines (e.g., access lines 13-16 and sense lines 70 in the above-described embodiments). Individual memory cells comprise an inner electrode, an outer electrode, and programmable material between the inner and outer electrodes. For example with respect to the above described embodiments, an individual memory cell 90/90a comprises an inner electrode 36, an outer electrode 48, and programmable material 46 there-between (FIGS. 15 and 18). The outer electrode comprises an outer electrode line common to a line of individual memory cells (e.g., outer electrode material 48 as part of a line 50/50a). The outer electrode line comprises a base and opposing sidewalls (e.g., a base 91 and opposing sidewalls 93/93a in FIGS. 15 and 18). The programmable material is across the base and at least portions of each of the opposing sidewalls of individual of the outer electrode lines.

The inner electrode of individual memory cells electrically couples to one of a pair of source/drain regions on opposing sides of one of the access lines. The other of the pair of source/drain regions electrically couples to one of the sense lines. For example with respect to the far-left memory cell 90 or 90a in FIGS. 15 and 18, respectively, source/drain regions 21 and 22 are a pair of source/drain regions on opposing sides of access line 13. Source/drain region 22 electrically couples to (i.e., or is part of) an inner electrode 30/36. Source/drain region 21 electrically couples to an overlying sense line 70.

In one embodiment, the programmable material is generally U-shaped in lateral cross section relative to the individual outer electrode lines (e.g., as shown in each of the embodiments of FIGS. 15 and 18). In one embodiment, the programmable material on at least one of the opposing sidewalls of the individual outer electrode lines has an elevationally outermost planar surface that is co-planar with a planar elevationally outermost surface of that individual outer electrode line. For example with respect to the embodiment of FIG. 18, materials 46 and 48 of individual memory cells 90a have devotionally outermost surfaces that are coplanar. In one embodiment, the programmable material is over all of each of the opposing sidewalls of the individual outer electrode lines (e.g., as in FIG. 18), and in another embodiment is over only some of each of the opposing sidewalls of the individual outer electrode lines (e.g., as in FIG. 15).

In one embodiment the programmable material comprises a base region and a pair of legs projecting elevationally outward relative to the base region. For example with respect to the embodiments of FIG. 15 and FIG. 18, example base regions 96 and legs 98/98a are shown.

In one embodiment, individual outer electrode lines are common to two immediately adjacent lines of individual memory cells. For example with respect to the embodiments of FIGS. 15 and 18, outer electrode lines individually comprising conductive electrode material 48 are over and common to two immediately adjacent lines 37 (FIG. 14) of individual memory cells.

Conclusion

In some embodiments, a method of forming an array of memory cells comprises forming lines of covering material that are elevationally over and along lines of spaced sense line contacts. Longitudinal orientation of the lines of covering material is used in forming lines comprising programmable material and outer electrode material that are between and along the lines of covering material. The covering material is removed over the spaced sense line contacts and the spaced sense line contacts are exposed. Access lines are formed. Sense lines are formed that are electrically coupled to the spaced sense line contacts. The sense lines are angled relative to the lines of spaced sense line contacts and relative to the access lines.

In some embodiments, a method of forming an array of memory cells comprises forming lines of covering material that are elevationally over and along lines of spaced sense line contacts. Void space between the lines of covering material is lined with programmable material. Outer electrode material is deposited over the programmable material to over-fill remaining void space between the lines of covering material. The outer electrode material is removed back at least to an elevationally outermost surface of the covering material to form lines comprising the programmable material and the outer electrode material, and to form coplanar elevationally outermost surfaces of the covering material and the outer electrode material. The covering material is removed over the spaced sense line contacts and the spaced sense line contacts are exposed. Access lines are formed. Sense lines are formed that are electrically coupled to the spaced sense line contacts. The sense lines are angled relative to the lines of spaced sense line contacts and relative to the access lines.

In some embodiments, a method of forming an array of memory cells comprises forming access lines relative to a substrate. Lines of spaced sense line contacts are formed between and along first pairs of the access lines and lines of spaced inner electrode material are formed between and along second pairs of the access lines. Lines of covering material are formed that are elevationally over and along the lines of the spaced sense line contacts and between the lines of spaced inner electrode material. Lines comprising programmable material and outer electrode material are formed that are between and along the lines of covering material and elevationally over and along the lines of spaced inner electrode material. The covering material is removed over the spaced sense line contacts and the spaced sense line contacts are exposed. Sense lines are formed that are electrically coupled to the spaced sense line contacts. The sense lines are angled relative to the lines of spaced sense line contacts, the lines of programmable material and outer electrode material, and the access lines.

In some embodiments, a method of forming an array of memory cells comprises forming lines of covering material that are elevationally over and along lines of spaced sense line contacts. Longitudinal orientation of the lines of covering material is used in forming lines comprising programmable material and outer electrode material that are between and along the lines of covering material. The programmable material is electrically coupled to spaced inner electrode material. The outer electrode material has an elevationally outer surface that is inward of an elevationally planar outer surface of the covering material. The outer electrode material is covered with dielectric material having an elevationally outer surface that is coplanar with that of the covering material of the lines of covering material. The covering material is etched over the spaced sense line contacts and the spaced sense line contacts are exposed. Access lines are formed. Sense lines are formed that are electrically coupled to the spaced sense line contacts. The sense lines are angled relative to the lines of spaced sense line contacts and relative to the access lines.

In some embodiments, a method of forming an array of memory cells comprises forming lines of covering material that are elevationally over and along lines of spaced sense line contacts. Anisotropically etched dielectric sidewall spacers are formed over sidewalls of the covering material. The dielectric spacers do not contain. Oxygen-sensitive programmable material is deposited over the lines of covering material, the spacers, and to line void space between the spacers. Outer electrode material is deposited over the lines of covering material and the spacers, and over the oxygen-sensitive programmable material to over-fill remaining void space between the spacers. The outer electrode material is removed back at least to an elevationally outermost surface of the covering material to form coplanar elevationally outermost surfaces of the covering material, the spacers, the oxygen-sensitive programmable material, and the outer electrode material. The outermost surfaces of the oxygen-sensitive programmable material and the outer electrode material are elevationally recessed relative to the elevationally outermost surfaces of the covering material. Dielectric material is deposited over the outer electrode material, the oxygen-sensitive programmable material, the spacers, and the covering material. The dielectric material is of different composition from that of the covering material and does not contain oxygen. The dielectric material is removed back at least to an elevationally outermost surface of the covering material. The lines of covering material are etched away selectively relative to the dielectric material and the dielectric spacers. Oxygen-containing dielectric is deposited over the dielectric material and the spacers, and to over-fill void space resulting from etching away the lines of covering material. Access lines are formed. Sense line trenches are etched into the oxygen-containing dielectric and are angled relative to the lines of spaced sense line contacts and relative to the access lines. Individual contact openings are etched into the oxygen-containing dielectric at bases of the sense line trenches to individual of the spaced sense line contacts. Conductive material is formed within the sense line trenches and contact openings to form sense lines.

In some embodiments, a method of forming an array of memory cells comprises forming sacrificial lines of covering material that are devotionally over and along lines of spaced sense line contacts. Longitudinal orientation of the sacrificial lines of covering material is used in forming lines comprising oxygen-sensitive programmable material and outer electrode material that are between and along the sacrificial lines of covering material. The oxygen-sensitive programmable material is electrically coupled to spaced inner electrode material. The sacrificial lines of covering material are etched away selectively relative to the outer electrode material. After the etching, exposed oxygen-sensitive programmable material is covered with a first dielectric that does not contain oxygen. An oxygen-containing second dielectric is formed over the first dielectric. Access lines are formed. Sense lines are formed over the second dielectric and which are electrically coupled to the spaced sense line contacts. The sense lines are angled relative to the lines of spaced sense line contacts and relative to the access lines.

In some embodiments, a memory array comprises access lines and sense lines angled relative to the access lines. Individual memory cells comprise an inner electrode, an outer electrode, and programmable material between the inner and outer electrodes. The outer electrode comprises an outer electrode line common to a line of individual memory cells. The outer electrode line comprises a base and opposing sidewalls. The programmable material is across the base and at least portions of each of the opposing sidewalls of individual of the outer electrode lines. The inner electrode of individual memory cells is electrically coupled to one of a pair source/drain regions on opposing sides of one of the access lines. The other of the pair of source/drain regions is electrically coupled to one of the sense lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array, comprising:
    access lines and sense lines longitudinally angled perpendicular relative to longitudinal orientation of the access lines;
    individual memory cells comprising an inner electrode, an outer electrode, and programmable material between the inner and outer electrodes; the outer electrode comprising an outer electrode line common to a line of individual memory cells; the outer electrode line comprising a base and opposing sidewalls; the programmable material being across the base and at least portions of each of the opposing sidewalls of individual of the outer electrode lines; and
    the inner electrode of individual memory cells electrically coupling to one of a pair source/drain regions on opposing sides of one of the access lines, the other of the pair of source/drain regions electrically coupling to one of the sense lines.

2. The memory array of claim 1 wherein the programmable material is generally U-shaped in lateral cross section relative to the individual outer electrode lines.

3. The memory array of claim 1 wherein the programmable material on at least one of the opposing sidewalls of the individual outer electrode lines has an elevationally outermost planar surface that is co-planar with a planar elevationally outermost surface of that individual outer electrode line.

4. The memory array of claim 1 wherein the programmable material is over all of each of the opposing sidewalls of the individual outer electrode lines.

5. The memory array of claim 1 wherein the programmable material is over only some of each of the opposing sidewalls of the individual outer electrode lines.

6. The memory array of claim 1 wherein the programmable material comprises a base region and a pair of legs projecting elevationally outward relative to the base region.

7. The memory array of claim 1 wherein individual outer electrode lines are common to two immediately adjacent lines of individual memory cells.

8. The memory array of claim 6 wherein the pair of legs curve laterally outward of the base region.

9. A memory array, comprising:
    individual memory cells comprising an inner electrode, an outer electrode, and programmable material between the inner and outer electrodes; the outer electrode comprising an outer electrode line common to a line of individual memory cells; the outer electrode line comprising a base and opposing sidewalls; the programmable material being across the base and at least portions of each of the opposing sidewalls of individual of the outer electrode lines;
    access lines below the outer electrode line and below the programmable material;
    sense lines above the outer electrode line, above the programmable material, and above the access lines; and
    the inner electrode of individual memory cells electrically coupling to one of a pair source/drain regions on opposing sides of one of the access lines, the other of the pair of source/drain regions electrically coupling to one of the sense lines.

10. The memory array of claim 9 wherein the access lines are in bulk semiconductor material, dielectric material being between the access lines and the bulk semiconductor material.

11. The memory array of claim 10 comprising isolation lines in the bulk semiconductor material between every two immediately-adjacent of the access lines.

12. The memory array of claim 11 wherein the isolation lines are conductive.

13. The memory array of claim 11 wherein the isolation lines are non-conductive.

14. The memory array of claim 11 wherein the isolation lines and the access lines are parallel one another.

15. The memory array of claim 14 wherein the isolation lines and the access lines are perpendicular to the sense lines.

16. The memory array of claim 9 wherein individual outer electrode lines are common to two immediately adjacent lines of individual memory cells.

17. A memory array, comprising:
    individual memory cells comprising an inner electrode, an outer electrode, and programmable material between the inner and outer electrodes; the outer electrode comprising an outer electrode line common to a line of individual memory cells; the outer electrode line comprising a base and opposing sidewalls; the programmable material being across the base and at least portions of each of the opposing sidewalls of individual of the outer electrode lines; the programmable material comprising a base region and a pair of legs projecting elevationally outward relative to the base region; the base region between the pair of legs having a maximum vertical thickness that is greater than a maximum horizontal thickness of each of the legs;

access lines below the outer electrode line and below the programmable material;

sense lines above the outer electrode line, above the programmable material, and above the access lines; and the inner electrode of individual memory cells electrically coupling to one of a pair source/drain regions on opposing sides of one of the access lines, the other of the pair of source/drain regions electrically coupling to one of the sense lines.

18. The memory array of claim 17 wherein the pair of legs curve laterally outward of the base region.

19. The memory array of claim 17 wherein the programmable material is over all of each of the opposing sidewalls of the individual outer electrode lines.

20. The memory array of claim 17 wherein the programmable material is over only some of each of the opposing sidewalls of the individual outer electrode lines.

* * * * *